United States Patent
Bradbury et al.

(10) Patent No.: US 10,303,759 B2
(45) Date of Patent: May 28, 2019

(54) MEMORY PRESERVING PARSE TREE BASED COMPRESSION WITH ENTROPY CODING

(71) Applicant: INTERNATIONAL BUSINESS MACHINES CORPORATION, Armonk, NY (US)

(72) Inventors: Jonathan D. Bradbury, Poughkeepsie, NY (US); Markus Helms, Boeblingen (DE); Christian Jacobi, Poughkeepsie, NY (US); Aditya N. Puranik, Bangalore (IN); Christian Zoellin, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 486 days.

(21) Appl. No.: 14/958,493

(22) Filed: Dec. 3, 2015

(65) Prior Publication Data

US 2017/0161362 A1 Jun. 8, 2017

(51) Int. Cl.
*G06F 17/27* (2006.01)
*G06F 3/06* (2006.01)
(Continued)

(52) U.S. Cl.
CPC ........ *G06F 17/2705* (2013.01); *G06F 3/0608* (2013.01); *G06F 3/0626* (2013.01); *G06F 3/0629* (2013.01); *G06F 3/0638* (2013.01); *G06F 3/0673* (2013.01); *G06F 16/2365* (2019.01); *G06F 16/9027* (2019.01);
(Continued)

(58) Field of Classification Search
None
See application file for complete search history.

(56) References Cited

U.S. PATENT DOCUMENTS 6,892,292 B2   5/2005   Henkel et al.
RE41,152 E     2/2010   Reynar et al.
(Continued)

OTHER PUBLICATIONS

Peter Mell et al., "The NIST Definition of Cloud Computing", National Institute of Standards and Technology, U.S. Department of Commerce, NIST Special Publication 800-145, Sep. 2011, 7 pages.

*Primary Examiner* — Tuankhanh D Phan
(74) *Attorney, Agent, or Firm* — Heslin Rothenberg Farley & Mesiti P.C.; William A. Kinnaman, Jr.

(57) ABSTRACT

A method, computer program product, and system includes a processor obtaining data including values and generating a value conversion dictionary by applying a parse tree based compression algorithm to the data, where the value conversion dictionary includes dictionary entries that represent the values. The processor obtains a distribution of the values and estimates a likelihood for each based on the distribution. The processor generates a code word to represent each value, a size of each code word is inversely proportional to the likelihood of the word. The processor assigns a rank to each code word, the rank for each represents the likelihood of the value represented by the code word; and based on the rank associated with each code word, the processor reorders each dictionary entry in the value conversion dictionary to associate each dictionary entry with an equivalent rank, the reordered value conversion dictionary comprises an architected dictionary.

18 Claims, 13 Drawing Sheets

(51) Int. Cl.
*G06F 16/23* (2019.01)
*G06F 16/901* (2019.01)
*H03M 7/30* (2006.01)
*H03M 7/40* (2006.01)

(52) U.S. Cl.
CPC ....... *H03M 7/3079* (2013.01); *H03M 7/3088* (2013.01); *H03M 7/40* (2013.01)

(56) References Cited

U.S. PATENT DOCUMENTS

| | | |
|---|---|---|
| 8,542,135 B2 | 9/2013 | Golander et al. |
| 8,643,515 B2 | 2/2014 | Cideciyan |
| 8,874,578 B2 | 10/2014 | Isaacson et al. |
| 9,020,262 B2 | 4/2015 | Depalov et al. |
| 2002/0063641 A1* | 5/2002 | Fish .................. H03M 7/3086 341/87 |
| 2009/0006399 A1* | 1/2009 | Raman .............. G06F 17/30498 |
| 2013/0103655 A1* | 4/2013 | Fanghaenel ....... G06F 17/30336 707/693 |

* cited by examiner

CMPSC   R₁,R₂                    [RRE]

| 'B263' | ///////// | R₁ | R₂ |
|--------|-----------|----|----|
0                    16         24   28  31

FIG. 8

MEMORY PRESERVING PARSE TREE BASED COMPRESSION WITH ENTROPY CODING

BACKGROUND

Two methods of data compression and decompression that can be integrated, separately as well as jointly, into software and hardware, are Ziv-Lempel compression and Huffman Coding. Ziv-Lempel is an example of parse tree based compression, where a value conversion dictionary is stored as a tree and parsed to locate conversion values. Huffman Coding, meanwhile, is a type of entropy coding, which compresses digital data by representing frequently occurring patterns with few bits and rarely occurring patterns with many bits. While Ziv-Lempel enables the compression of data of a variable length to symbols of a fixed length, Huffman Coding enables the compression of data of a fixed length into variable length code words. Systems utilizing these types of compression can store either a symbol (in Ziv-Lempel) and/or a code word (in Huffman Coding) in place of the data and through decompression, the data represented by either a symbols and/or a code word can be retrieved.

In Ziv-Lempel, program code searches in plain text for entries in a pre-determined dictionary and substitutes unique symbols, all of a consistent length, for the identified entries. To enable compression and decompression, one or more resources in the computer system stores the dictionary, which can be represented by one or more parse trees. Because the symbols utilized to represent the identified text are all of a fixed length, if a given string is not represented by a symbol in the dictionary, the fixed length must be extended to enable compression of this string. Because all symbols are of the same width, in order to compress this one unrepresented string, the size of the system as a whole must be inflated.

In Huffman Coding, the frequency of a certain strings is inversely proportional to the length of the code word used to represent it upon compression. Thus, strings that appear with a higher frequency, are represented by shorter code words, while strings that appear less frequently, are represented with longer code words. In order to translate a string into a code word, or vice versa, the frequency/rank of the word and/or the words themselves must be stored. In a type of Huffman Coding called Canonical Huffman Coding, the memory stores the ranks of the strings. The efficiency of systems utilizing this compression and the resources required to store the code words is determined by the frequency of certain data strings. Thus, a lack of repetition in values could result in an increased storage requirement.

Both Ziv-Lempel and Huffman Coding have drawbacks that impact software and hardware systems through limitations in data retention and retrieval. Ziv-Lempel and Huffman Coding can be utilized together within the same system, which can decrease overhead overall, but even this scheme has inefficiencies, as it introduces not only an additional memory access, but may increase the amount of system memory required overall. An example of a hardware architecture where these two compression methods are jointly implemented is the z/Architecture offered by International Business Machines Corporation (IBM); z/Architecture is a registered trademark of International Business Machines Corporation, Armonk, N.Y., USA. In hardware design, storage (bandwidth) can be finite on certain resources, so eliminating any inefficiencies in data retention and retrieval is desirable in order to maximize the functionality of the existing hardware.

Systems combining Ziv-Lempel and Huffman Coding can take advantage of situations where compression from variable length to fixed length is more desirable and when compression from fixed length to variable length is more desirable. But when these methods are combined, the system performs a translation from symbol (in Ziv-Lempel) to rank (in Canonical Huffman Coding) and performing this translation requires an additional memory access that can be both expensive and unpredictable. This lookup is additional because, as explained above, data compression and decompression with Ziv-Lempel and Huffman Coding already necessitates memory accesses. Also, performing this additional lookup may also require additional space in memory. Thus, a need exists for a method that takes advantage of existing data compression technologies reducing additional memory accesses or space.

SUMMARY

Shortcomings of the prior art are overcome and additional advantages are provided through the provision of a computer program product for reducing memory accesses during digital data compression and decompression. The computer program product comprises a storage medium readable by a processing circuit and storing instructions for execution by the processing circuit for performing a method. The method includes, for instance: obtaining, by a processor, data comprised of values and generating a value conversion dictionary by applying a parse tree based compression algorithm to the data, wherein the value conversion dictionary is comprised of dictionary entries that represent the values; obtaining, by the processor, a distribution of the values and estimating a likelihood for each value based on the distribution; generating, by the processor, a code word to represent each value, wherein a size of each code word is inversely proportional to the likelihood of the code word; assigning, by the processor, a rank to each code word, wherein the rank for each code word represents the likelihood of the value represented by the code word; and based on the rank associated with each code word, reordering, by the processor, each dictionary entry in the value conversion dictionary to associate each dictionary entry with an equivalent rank, wherein the reordered value conversion dictionary comprises an architected dictionary.

Shortcomings of the prior art are overcome and additional advantages are provided through the provision of a method of reducing memory accesses during digital data compression and decompression. The method includes, for instance: obtaining, by a processor, data comprised of values and generating a value conversion dictionary by applying a parse tree based compression algorithm to the data, wherein the value conversion dictionary is comprised of dictionary entries that represent the values; obtaining, by the processor, a distribution of the values and estimating a likelihood for each value based on the distribution; generating, by the processor, a code word to represent each value, wherein a size of each code word is inversely proportional to the likelihood of the code word; assigning, by the processor, a rank to each code word, wherein the rank for each code word represents the likelihood of the value represented by the code word; and based on the rank associated with each code word, reordering, by the processor, each dictionary entry in the value conversion dictionary to associate each dictionary entry with an equivalent rank, wherein the reordered value conversion dictionary comprises an architected dictionary.

Shortcomings of the prior art are overcome and additional advantages are provided through the provision of a system for reducing memory accesses during digital data compression and decompression. The system includes a memory, one or more processor in communication with the memory, and program instructions executable by the one or more processor via the memory to perform a method. The method includes, for instance: obtaining, by a processor, data comprised of values and generating a value conversion dictionary by applying a parse tree based compression algorithm to the data, wherein the value conversion dictionary is comprised of dictionary entries that represent the values; obtaining, by the processor, a distribution of the values and estimating a likelihood for each value based on the distribution; generating, by the processor, a code word to represent each value, wherein a size of each code word is inversely proportional to the likelihood of the code word; assigning, by the processor, a rank to each code word, wherein the rank for each code word represents the likelihood of the value represented by the code word; and based on the rank associated with each code word, reordering, by the processor, each dictionary entry in the value conversion dictionary to associate each dictionary entry with an equivalent rank, wherein the reordered value conversion dictionary comprises an architected dictionary.

Methods and systems relating to one or more aspects are also described and claimed herein. Further, services relating to one or more aspects are also described and may be claimed herein.

Additional features and advantages are realized through the techniques described herein. Other embodiments and aspects are described in detail herein and are considered a part of the claimed aspects. For example, aspects of embodiments of the present invention may also include: obtaining, by the processor, additional data and compressing the data utilizing the architected dictionary. The compressing may include walking, by the processor, from dictionary entries to ranks without performing a memory lookup.

Aspects of certain embodiment of the present invention may also include: obtaining, by the processor, a code word, and decompressing the code word utilizing the architected dictionary. The decompressing may include walking, by the processor, from ranks to dictionary entries without performing a memory lookup.

In and embodiment of the present invention, the value conversion dictionary comprises references for each dictionary entry describing parent and child relationships associated with the dictionary entry. In a further embodiment of the present invention the reordering comprises associating, by the processor, each dictionary entry with a rank; sorting, by the processor, each dictionary entry according to the rank assigned; updating, by the processor, references for each dictionary entry; and discarding, by the processor, locations for each dictionary entry in the value conversion dictionary prior to the updating. In a further embodiment of the present invention the sorting further comprises retaining, in a memory, the locations for each dictionary entry in the value conversion dictionary.

Aspects of certain embodiments of the present invention may also include: storing, by the processor, the value conversion dictionary as at least one tree structure in a memory. In an embodiment of the present invention, the parse tree based compression algorithm is a Ziv-Lempel compression algorithm. In an embodiment of the present invention, the generating and the assigning comprise generating Canonical Huffman Code. In an embodiment of the present invention, the values are of variable size and the dictionary entries are of a fixed size.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

FIG. 8 is an instruction that may be utilized in a system where aspects of certain embodiments of the present invention have been implemented.

DETAILED DESCRIPTION

Figure 1:
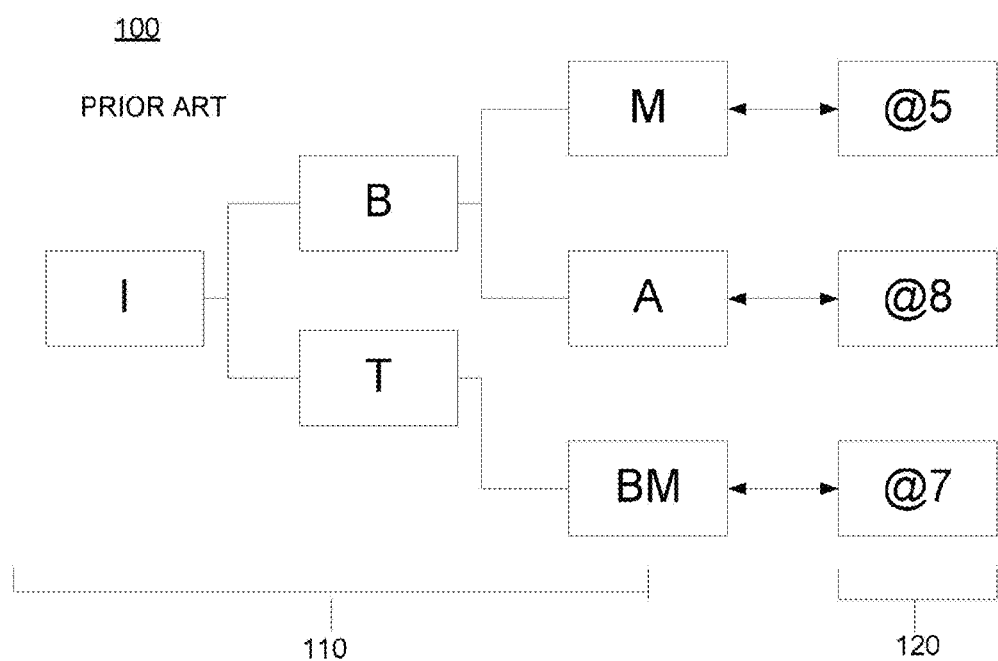
FIG. 1 depicts an example of Ziv-Lempel compression, as integrated into certain hardware and software environments.

The accompanying figures, in which like reference numerals refer to identical or functionally similar elements throughout the separate views and which are incorporated in and form a part of the specification, further illustrate the present invention and, together with the detailed description of the invention, serve to explain the principles of the present invention. As understood by one of skill in the art, the accompanying figures are provided for ease of understanding and illustrate aspects of certain embodiments of the present invention. The invention is not limited to the embodiments depicted in the figures.

As understood by one of skill in the art, program code, as referred to throughout this application, includes both software and hardware. For example, program code in certain embodiments of the present invention includes fixed function hardware, while other embodiments utilized a software-based implementation of the functionality described. Certain embodiments combine both types of program code. In certain embodiments of the present invention, fixed function hardware executes all aspects described below that include compression and decompression, with the exception of generating dictionaries, which is accomplished by a software program code embodiment.

An embodiment of the present invention increases the efficiency of digital data compression and decompression in a computing environment by reordering values in a data structure utilized for parse tree based compression in order to eliminate memory accesses when coordinating values from this data structure to values utilized in entropy coding.

In aspects of certain embodiments of the present invention, program code selects symbols to represent data compressed utilizing parse tree based compression with values equivalent to ranks coordinating to code words utilized to represent data compressed utilizing entropy coding. In an embodiment of the present invention, program code generates a unique value conversion dictionary for use in parse tree based compression and decompression that minimizes memory accesses when coordinating values from the parse tree based compression and decompression with values derived from entropy coding.

Aspects of embodiments of the present invention integrate parse tree based compression and entropy coding for digital data compression in hardware and software systems without introducing an additional memory lookup and therefore, eliminating the additional memory space required in existing systems that combine these approaches. Embodiments of the present invention thus improve both the performance of systems into which they are integrated and reduce the overhead of these systems.

An embodiment of the present invention includes a computer-implemented method, computer program product performing a method, and computer system performing a method that includes: obtaining, by a processor, data comprised of values and generating a value conversion dictionary by applying a parse tree based compression algorithm to the data, wherein the value conversion dictionary is comprised of dictionary entries that represent the values; obtaining, by the processor, a distribution of the values and estimating a likelihood for each value based on the distribution; generating, by the processor, a code word to represent each value, wherein a size of each code word is inversely proportional to the likelihood of the code word; assigning, by the processor, a rank to each code word, wherein the rank for each code word represents the likelihood of the value represented by the code word; and based on the rank associated with each code word, reordering, by the processor, each dictionary entry in the value conversion dictionary to associate each dictionary entry with an equivalent rank, wherein the reordered value conversion dictionary comprises an architected dictionary.

In an embodiment of the present invention, the method also includes: obtaining, by the processor, additional data and compressing the data utilizing the architected dictionary.

In an embodiment of the present invention, the method also includes: obtaining, by the processor, a code word, and decompressing the code word utilizing the architected dictionary.

In an embodiment of the present invention, the generating and the assigning comprise generating Canonical Huffman Code.

In an embodiment of the present invention, the values are of variable size and the dictionary entries are of a fixed size.

In an embodiment of the present invention, the method also includes: storing, by the processor, the value conversion dictionary as at least one tree structure in a memory.

In an embodiment of the present invention, the value conversion dictionary comprises references for each dictionary entry describing parent and child relationships associated with the dictionary entry.

In an embodiment of the present invention, the method also includes: obtaining, by the processor, additional data and compressing the data utilizing the architected dictionary and the compressing comprises walking, by the processor, from dictionary entries to ranks without performing a memory lookup.

In an embodiment of the present invention, the method also includes: obtaining, by the processor, code words and decompressing the data utilizing the architected dictionary and the decompressing comprises walking, by the processor, from ranks to dictionary entries without performing a memory lookup.

In an embodiment of the present invention, the parse tree based compression algorithm is a Ziv-Lempel compression algorithm.

In an embodiment of the present invention, the aforementioned reordering includes: associating, by the processor, each dictionary entry with a rank; sorting, by the processor, each dictionary entry according to the rank assigned; updating, by the processor, references for each dictionary entry; and discarding, by the processor, locations for each dictionary entry in the value conversion dictionary prior to the updating.

In an embodiment of the present invention, the aforementioned sorting includes retaining, in a memory, the locations for each dictionary entry in the value conversion dictionary.

Figure 2:
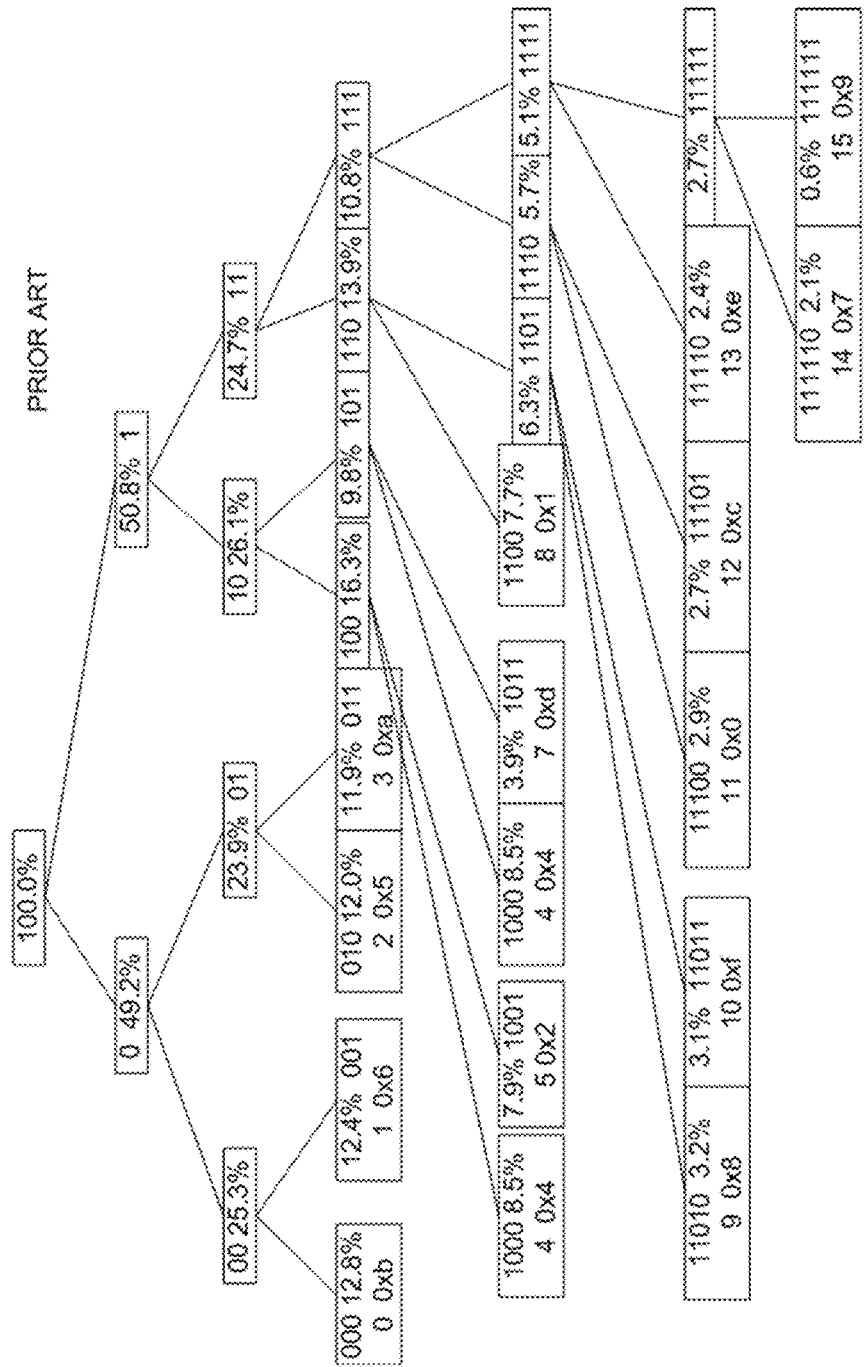
FIG. 2 depicts an example of Canonical Huffman Coding, as integrated into certain hardware and software environments.
Figure 3:
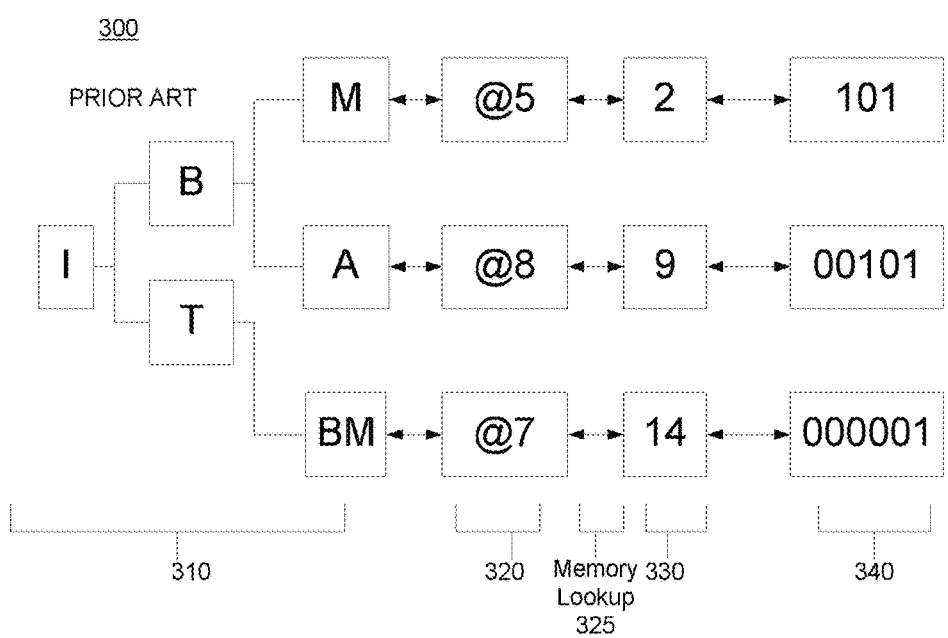
FIG. 3 depicts an issue with combining parse tree based compression and entropy coding in digital data compression.

To illustrate the advantages of embodiments of the present invention over both parse tree based compression and entropy coding, as well as current combinations of these methods, Ziv-Lempel (a parse tree based compression), Huffman Coding (an entropy-based coding), and the technological challenges introduced by combining these methods, or any parse tree based compression and entropy coding, are described in reference to FIGS. 1-3.

Parse tree based compression and entropy coding represent two methods of data compression and decompression that can be integrated into software and hardware systems to increase the overall efficiency of these computer systems. In particular, Ziv-Lempel, an example of parse tree based compression, and Huffman Coding, an example of entropy-based coding, are combined in certain hardware and software systems and together, are more effective than individually. An example of one architecture that employs both this methods jointly to compress and decompress digital data is the z/Architecture offered by International Business Machines Corporation (IBM). One embodiment of the z/Architecture is described in "z/Architecture Principles of Operation," IBM Publication No. SA22-7832-10, March 2015, which is hereby incorporated herein by reference in its entirety.

Ziv-Lempel and Huffman Coding, when utilized together in the same system can decrease overhead overall, but introduce an inefficiency of not only an additional memory access, but also may increase the amount of system memory required overall. Although decreasing memory accesses and storage requirements is always desirable and will positively impact the functionality of a computing system, in hardware design, these goals are of particular importance. Storage can be finite on certain hardware resources, so eliminating any inefficiencies in data retention and retrieval is desirable to order to maximize the functionality of the existing hardware. Additionally, because memory resources can be limited, accesses to data in these resources can tax the system as they are particularly expensive as well as unpredictable in this environment.

FIG. 1 depicts an example of Ziv-Lempel compression, as integrated into certain hardware and software environments, including but not limited to, the aforementioned z/Architecture. To compress digital data, program code, which, as explained above, can include both fixed function hardware as well as software, searches in plain text for entries in a pre-determined dictionary and emits unique symbols, all of a fixed length, for the identified entries. The tree 100 depicted in this figure is stored as a data structure in a memory and parsed to convert variable length values 110 to into fixed length symbols 120. Compression occurs by walking/depth-first searching along the tree 100 and emitting a symbol 120 that identifies a location in the tree 100. Thus, upon obtaining the value "IBM," program code would parse the tree 100 and emit the symbol @5. Upon obtaining the value "ITBM," program could would parse the tree 100 and emit the value @7. To decompress (i.e., convert the symbols 120 back to the values 110 that they represented), program code walks along an inverted tree, from referenced location to root. In order to decrease the memory accesses required to compress and decompress values, in some systems, two trees are stored separately, one for compression and another for decompression, so that the program code can utilize a single pointer per entry, rather than two, if walking both directions. U.S. Pat. No. 5,442,350, which is hereby incorporated herein by reference in its entirety, includes a description of Ziv-Lempel compression and decompression utilizing two trees.

FIG. 2 depicts an example of Canonical Huffman Coding, as integrated into certain hardware and software environments, including but not limited to, the aforementioned z/Architecture. The values compressed (and decompressed) using Canonical Huffman Coding are of a fixed length, while the code words the program code emits to represent these values are of variable length. In Huffman Coding, frequently-appearing values are assigned shorter representations and less common values are assigned longer representations. Referring to FIG. 2, the Huffman Tree 200 pictured illustrates the conversion of values to code words based on frequency. The binary code values represent the data to be compressed. The percentages represent the weight/frequency of the adjacent values. The values on the tree branches below the binary code and the percentages represent the code words assigned to the values, and the boxed values represent the location in the Huffman Tree when counting all code words left to right. From the Huffman Tree 200, program code can compute the rank (frequency relative to all other code words) of each code word.

FIG. 3 depicts an issue with combining parse tree based compression and entropy coding for digital data compression, including but not limited to the examples of Ziv-Lempel and Huffman Coding depicted in FIGS. 1-2. When parse tree based compression and entropy coding are combined, program code translates symbols emitted in parse tree based compression to code words determined through entropy coding. Although program code can convert a rank 330 to a code word 340 arithmetically (as this is determined by frequency of use), the program code must access the memory, i.e., perform a memory lookup 325, to convert from symbol 320 to rank 330. Symbols 320 can be mapped to code words 340, but because the ranks 330 are determined based on an order of likelihood, and this likelihood is stored in memory. The order of code words vs. the order of symbols are not related except by the likelihood, so the program code must access a lookup table that maps code words to likelihoods or the program code must access the likelihoods themselves. To compress the values 310 to symbols 320 using parse tree based compression, the program code performs accesses to at least one data structure in memory. The additional memory access to move from symbol 320 to rank 330 represents can further tax the resources of the system as this lookup can be both expensive and unpredictable and the additional memory bandwidth needed directly results in reduced compression and decompression performance (since the operation is dominated by memory accesses)

Figure 4:
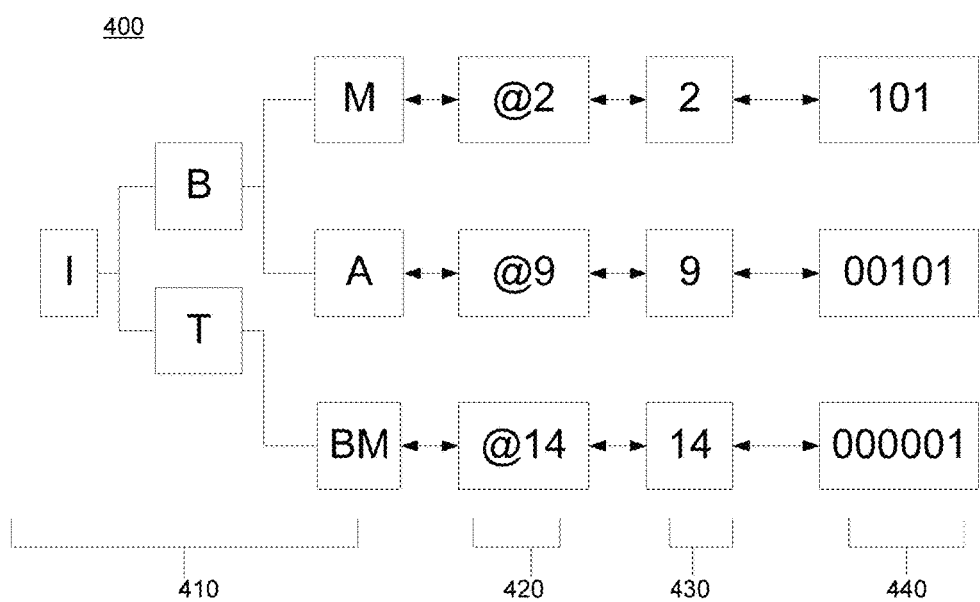
FIG. 4 depicts a result of implementing certain aspects of an embodiment of the present invention in a computer system.

FIG. 4 depicts a result of implementing certain aspects of an embodiment of the present invention in a computer system. When contrasted with FIG. 3, in FIG. 4, navigating from a symbol 420 to a rank 440 does not require program code to perform a lookup on a memory resource. Rather, because the symbol 420 has the same value as the rank 430, the program code can walk from a symbol 420 to a code word 450 without accessing a memory resource to perform a lookup, as required in the example in FIG. 3.

Figure 5:
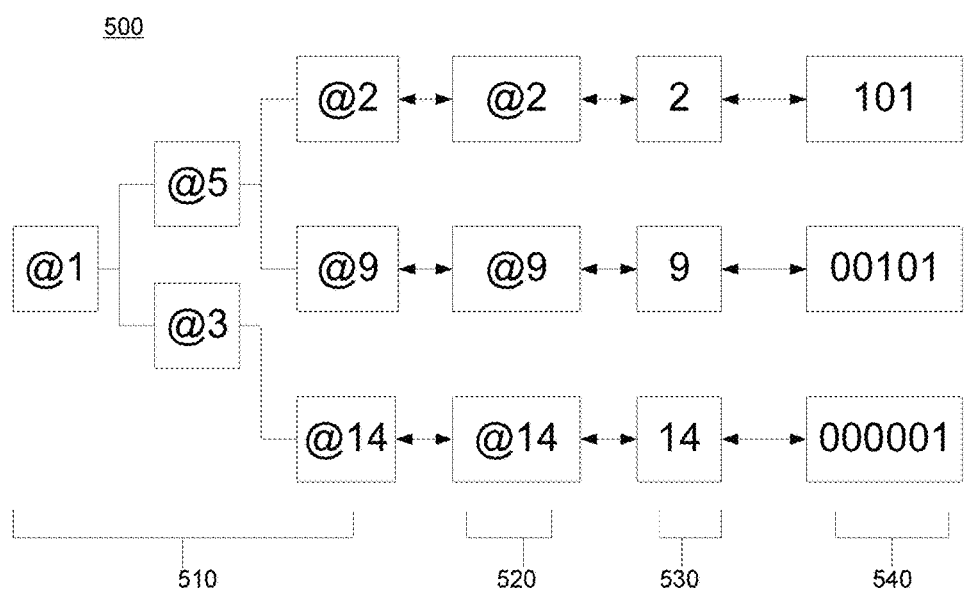
FIG. 5 illustrates an example of a data structure that can be generated and utilized in aspects of certain embodiments of the present invention.

FIG. 5 illustrates an example of a data structure that can be generated and utilized in aspects of certain embodiments of the present invention. Referring to FIG. 5, taking advantage of the variable length of values that can be compressed by parse tree based compression, in an embodiment of the present invention, program code, which can be understood as program 40 in FIG. 11, can assign symbols to each value and in each case, the symbols assigned can coordinate with ranks in an entropy coding structure. In FIG. 5, program code 40 (FIG. 11) has assigned to each of the values 510 a symbol 520 that represents a rank 530.

As aforementioned, an advantage of aspects of certain embodiments of the present invention is that these embodiments eliminate the need to access memory when moving between values representing data in a compression and/or decompression model that combines different data compression and decompression methods in a common computing environment.

Figure 6:
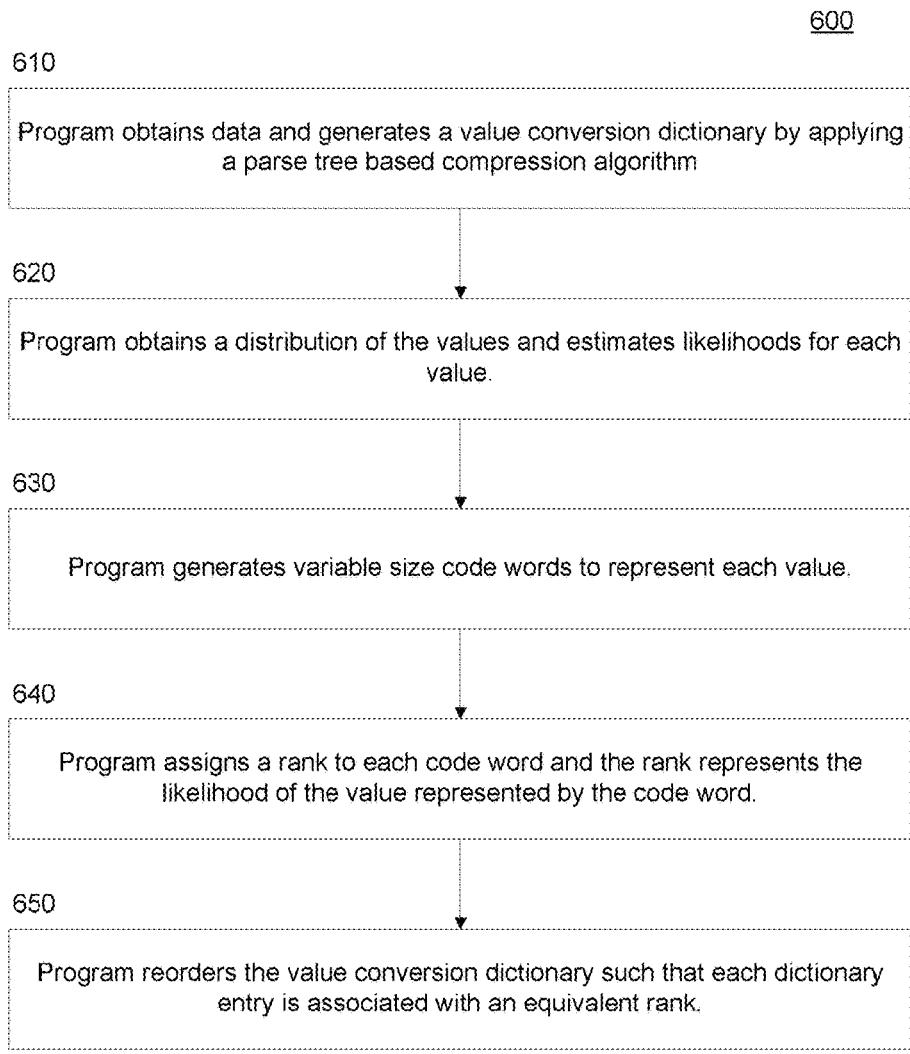
FIG. 6 is a workflow diagram depicting aspects of the present technique.

FIG. 6 depicts a workflow 600 of aspects of an embodiment of the present invention. In an embodiment of the present invention, program code 40 (e.g., FIG. 11) obtains data and generates a value conversion dictionary by applying a parse tree based compression algorithm (610). The data is comprised of a plurality of values. Each value is a string of variable size. In the values conversion dictionary, each value of the plurality of values is represented by a dictionary entry, including but not limited to, a symbol. Each dictionary entry is a fixed size.

In an embodiment of the present invention, the program code 40 stores the value conversion dictionary in a memory (e.g., FIG. 11, memory 28) as at least one tree where each dictionary entry includes a reference describing a location of the dictionary entry on the tree, which may include data regarding a parent dictionary entry and any child dictionary entries.

Returning to FIG. 6, the program code 40 obtains a distribution of the values and estimates likelihoods for each value (620). The program code 40 determines a likelihood for a value based on how often the value occurs in the data. Based on the likelihoods, the program code 40 generates variable size code words to represent each value (630). The size of the code word is directly proportional to the likelihood of the value. The program code 40 assigns a rank to each code word and the rank represents the likelihood of the value represented by the code word (640). In an embodiment of the present invention, the generating of the code words and assigning ranks to the code words includes generating Canonical Huffman Code.

In an embodiment of the present invention, based on the ranks associated with the code words, the program code 40 reorders the value conversion dictionary such that each dictionary entry is associated with an equivalent rank (650). As discussed earlier, FIG. 5 depicts the resultant assignment of a dictionary entry (e.g., symbol) to a rank. Upon completion of the reordering, the value conversion dictionary can be utilized by the program code 40 for compression and decompression and when performing the compression or the decompression, the program code 40 will not access a memory resource when walking from a dictionary entry to a code word, or vice versa. Thus, the program code 40 can locate a rank relevant to a dictionary entry without accessing a memory resource on a computer system.

In an embodiment of the present invention, the parse tree based compression algorithm applied by the program code 40 is a Ziv-Lempel compression algorithm. In an embodiment of the present invention, the program code determines the likelihood and generates variable size code words by applying Huffman Coding.

Figure 7:
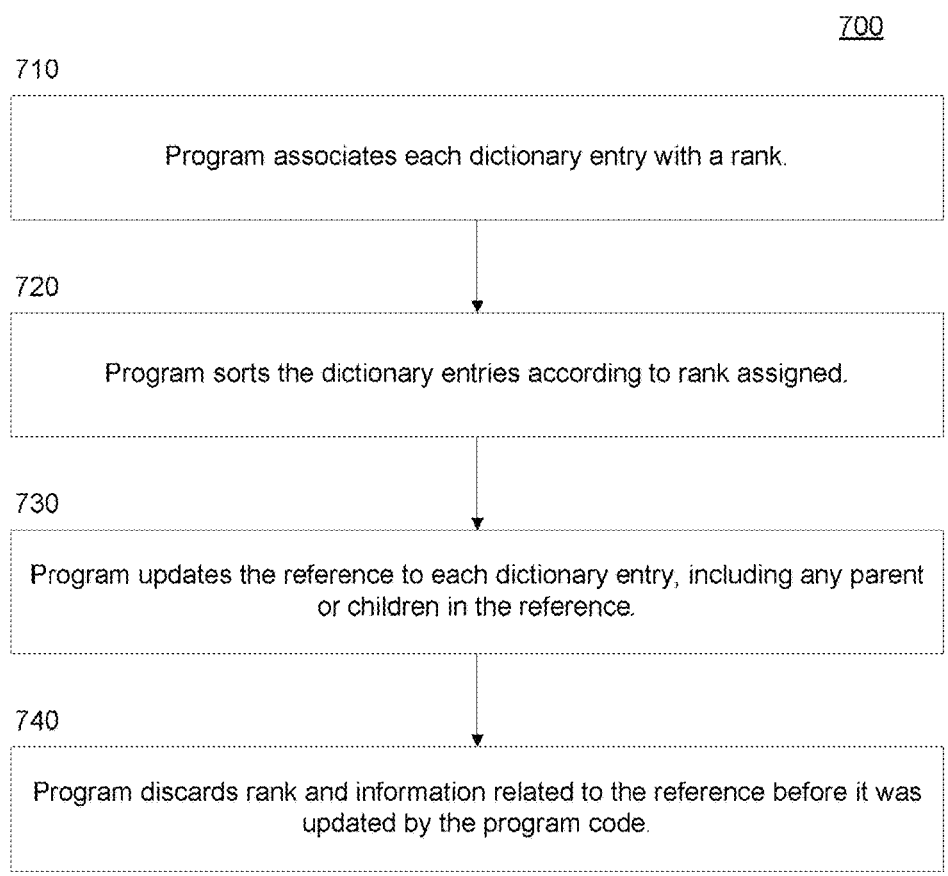
FIG. 7 is a workflow diagram depicting aspects of the present technique.

FIG. 7 depicts an example of a workflow 700 for reordering a value conversion dictionary (see, e.g., FIG. 6, 650) in accordance with aspects of certain embodiments of the present invention. To reorder the dictionary, the program code 40 associates each dictionary entry with a rank (710). The program code 40 sorts the dictionary entries according to rank assigned (720). In an embodiment of the present invention, when the program code 40 sorts the dictionary entries, it retains in memory (e.g., FIG. 11, memory 28) the original location of each dictionary entry in the value conversion dictionary. Based on sorting the dictionary entries, the program code 440 updates the reference to each dictionary entry, including any parent or children in the reference (730). The program code 40 discards rank and information related to the reference before it was updated by the program code (740).

Figure 8:
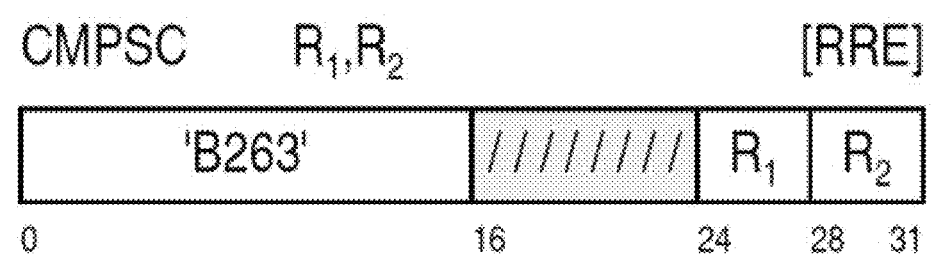
Figure 9:
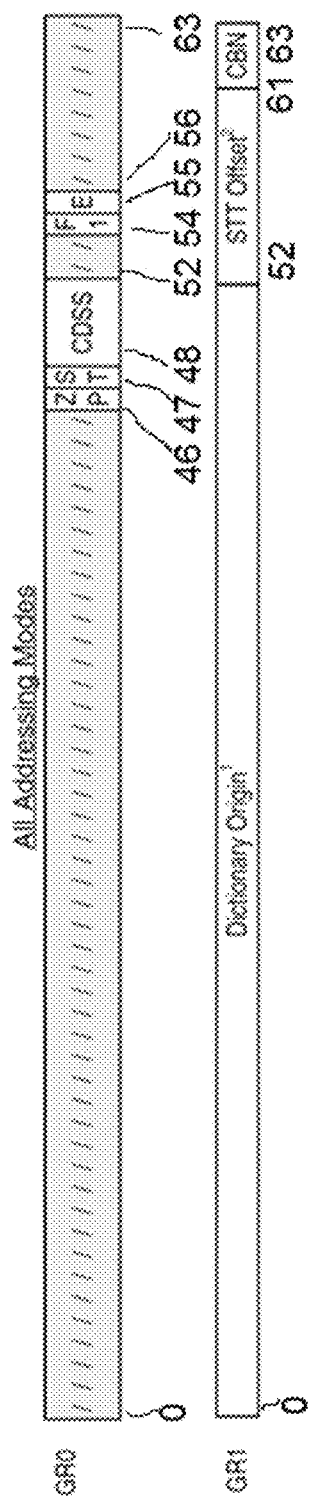
FIG. 9 is an instruction that may be utilized in a system where aspects of certain embodiments of the present invention have been implemented.

The joint utilization of parse tree based compression and entropy coding for data compression and decompression in accordance with the present invention may be triggered by an instruction. FIGS. 8 and 9 depict parts of instructions, which can be utilized in accordance with aspects of the present invention. One of skill in the art may recognize the instructions in these figures as complying with a format utilized in the aforementioned z/Architecture. However, these instructions are merely offered as one example of an implementation and are meant to illustrate a possible integration of the present invention into a hardware instruction. One of skill in the art will recognize that aspects of this implementation may be applied across instructions of varying formats.

FIG. 8 depicts an example of an instruction that may be utilized for digital data compression. In this example, R1 is target operand register pair (i.e. R1 stores target address and R1+1 stores length of allocated buffer). R2 is the src operand register pair (i.e., R2 stores source address and R2+1 stores length of source).

FIG. 9 depicts one example of how references to parse tree based compression and entropy coding can be included in an instruction. For this purpose, an instruction may include two registers that each contain information related to one of these compression methods. In the example in FIG. 9, the instruction includes two hard-coded registers for configuration. In the instruction, a parse tree stored at location "Dictionary Origin" while a descriptor for an entropy coding approach is stored at offset "STT Offset" in dictionary. In this example, the descriptor is a Huffman descriptor. In an embodiment of the present invention, an indicator is added to an instruction, such as the instruction in FIGS. 8-9. This indicator, which can include but is not limited to, a bit, enables support for the combined parse tree based compression and entropy coding described. In an embodiment of the present invention, the indicator may be included in the GR0 register, depicted in FIG. 9. In an embodiment of the present invention, the value of the indicator would enable or disable the described joint use of these compression and decompression methods for digital data compression and decompression within a computer system. In an embodiment of the present invention, the indicator may be located in the instruction at a well-defined location, such that the program code/hardware can check for the indicator and compress or decompress data in accordance with the instruction. In an embodiment of the present invention, by changing the value of the indicator, program code may enable or disable the joint compression and decompression method described herein.

Figure 10:
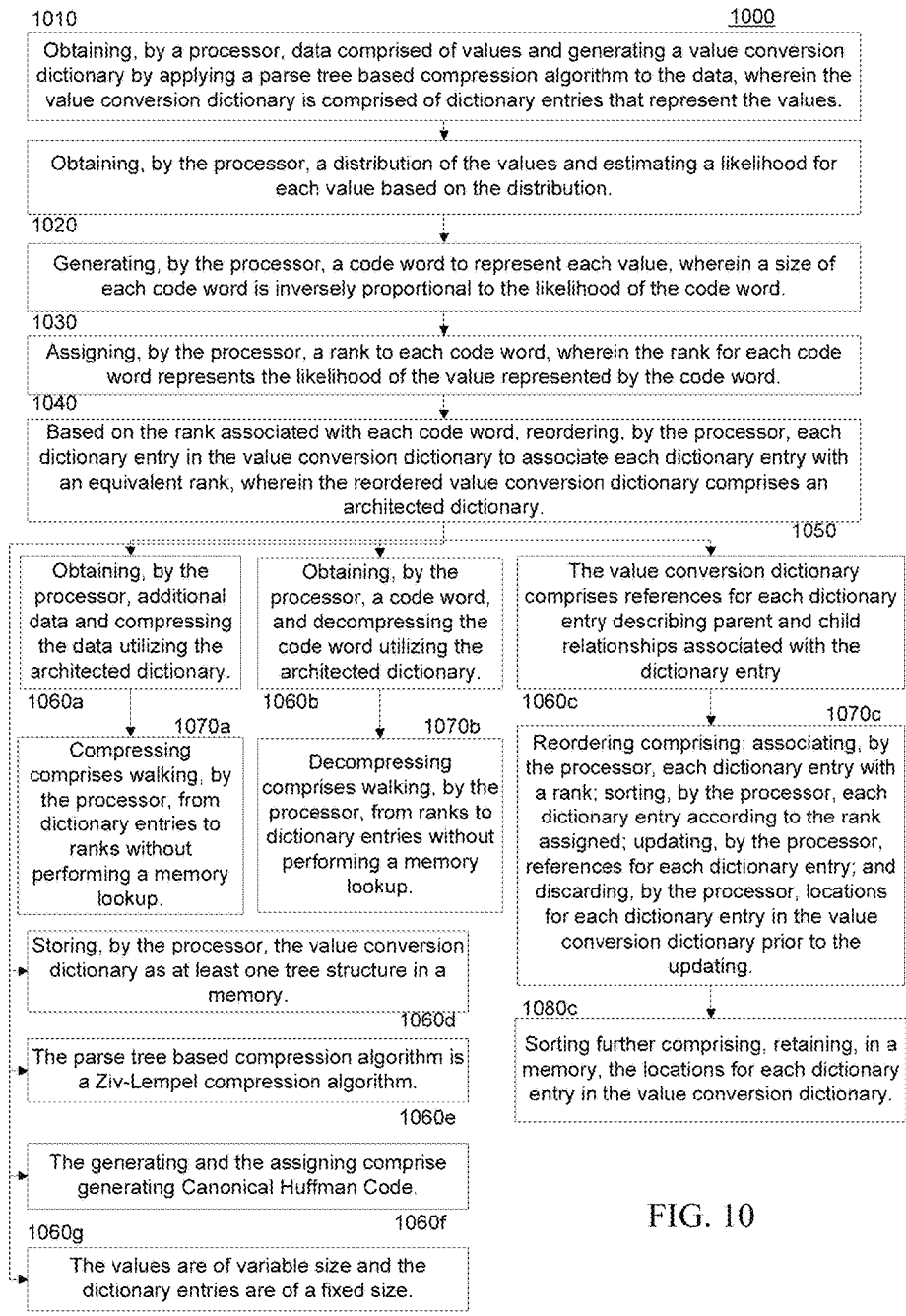
FIG. 10 is a workflow diagram depicting aspects of the present technique.

FIG. 10 is a workflow 1000 depicting certain aspects of an embodiment of the present invention. The method depicted in FIG. 10 includes: obtaining, by a processor, data comprised of values and generating a value conversion dictionary by applying a parse tree based compression algorithm to the data, wherein the value conversion dictionary is comprised of dictionary entries that represent the values (1010); obtaining, by the processor, a distribution of the values and estimating a likelihood for each value based on the distribution (1020); generating, by the processor, a code word to represent each value, wherein a size of each code word is inversely proportional to the likelihood of the code word (1030); assigning, by the processor, a rank to each code word, wherein the rank for each code word represents the likelihood of the value represented by the code word (1040); and based on the rank associated with each code word, reordering, by the processor, each dictionary entry in the value conversion dictionary to associate each dictionary entry with an equivalent rank, wherein the reordered value conversion dictionary comprises an architected dictionary (1050).

As depicted in FIG. 10, aspects of the present invention may also include: obtaining, by the processor, additional data and compressing the data utilizing the architected dictionary (1060a). The compressing may include walking, by the processor, from dictionary entries to ranks without performing a memory lookup (1070a).

As depicted in FIG. 10, aspects of the present invention may also include: obtaining, by the processor, a code word, and decompressing the code word utilizing the architected dictionary (1060b). The decompressing may include walking, by the processor, from ranks to dictionary entries without performing a memory lookup (1060b).

As depicted in FIG. 10, in an embodiment of the present invention, the value conversion dictionary comprises references for each dictionary entry describing parent and child relationships associated with the dictionary entry (1060c). In a further embodiment of the present invention the reordering comprises associating, by the processor, each dictionary entry with a rank; sorting, by the processor, each dictionary entry according to the rank assigned; updating, by the processor, references for each dictionary entry; and discarding, by the processor, locations for each dictionary entry in the value conversion dictionary prior to the updating (1070c). In a further embodiment of the present invention the sorting further comprises retaining, in a memory, the locations for each dictionary entry in the value conversion dictionary (1080c).

As depicted in FIG. 10, aspects of the present invention may also include: storing, by the processor, the value conversion dictionary as at least one tree structure in a memory (1060*d*).

As depicted in FIG. 10, in an embodiment of the present invention, the parse tree based compression algorithm is a Ziv-Lempel compression algorithm (1060*e*).

As depicted in FIG. 10, in an embodiment of the present invention, the generating and the assigning comprise generating Canonical Huffman Code (1060*f*).

As depicted in FIG. 10, in an embodiment of the present invention, the values are of variable size and the dictionary entries are of a fixed size (1060*g*).

As examples, each server is a central electronics complex based on the z/Architecture offered by International Business Machines Corporation (IBM); the hardware management console is, for instance, a personal computer, such as an Intel-based personal computer with a DVD-RAM (digital video disk-random access memory), as a particular example, or other type of computer or processing device that includes functionality to provide a standard interface for configuring and operating partitioned and SMP (Symmetric Multiprocessing) systems, such as System z offered by International Business Machines Corporation; and each support element is, for instance, a workstation coupled to the central processing complex used for monitoring and operating a system. Example hardware management consoles and support elements are based on technology offered by International Business Machines Corporation.

One or more aspects may relate to cloud computing.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for loadbalancing between clouds).

A cloud computing environment is service oriented with a focus on statelessness, low coupling, modularity, and semantic interoperability. At the heart of cloud computing is an infrastructure comprising a network of interconnected nodes.

Figure 11:
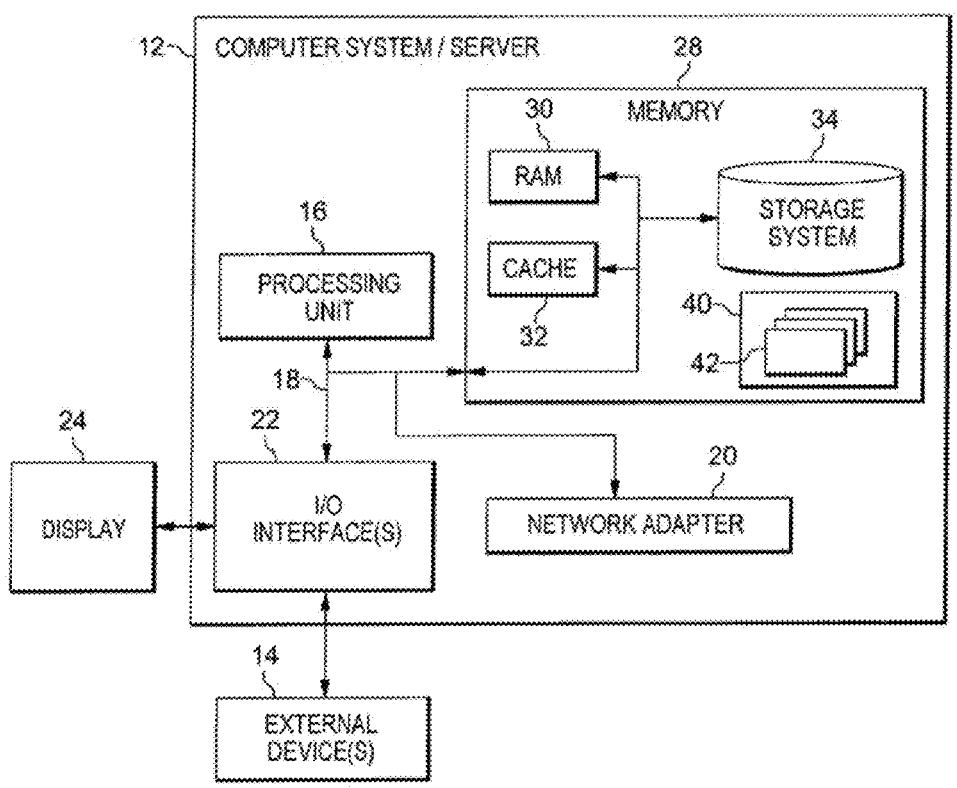
FIG. 11 depicts one embodiment of a cloud computing node.

Referring now to FIG. 11, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 11, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 12:
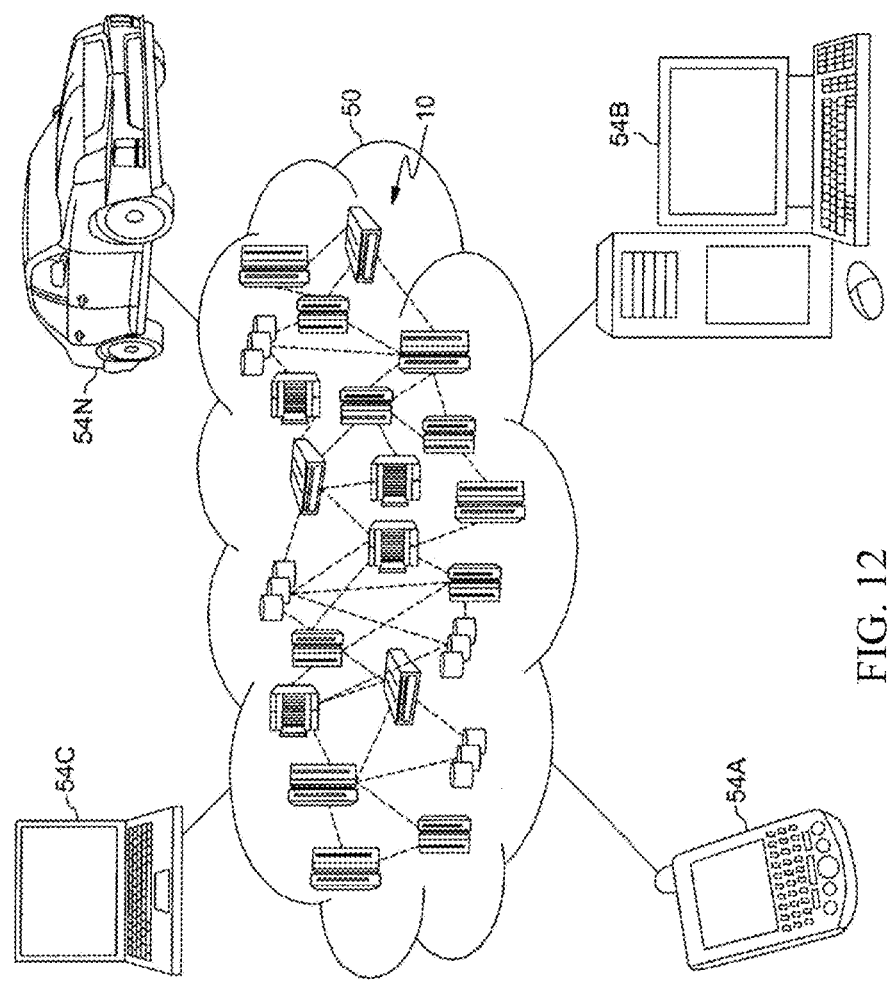
FIG. 12 depicts one embodiment of a cloud computing environment.

Referring now to FIG. 12, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 12 are intended to be illustrative only and that computing nodes 10 and cloud computing environment 50 can communicate with any type of computerized device over any type of network and/or network addressable connection (e.g., using a web browser).

Figure 13:
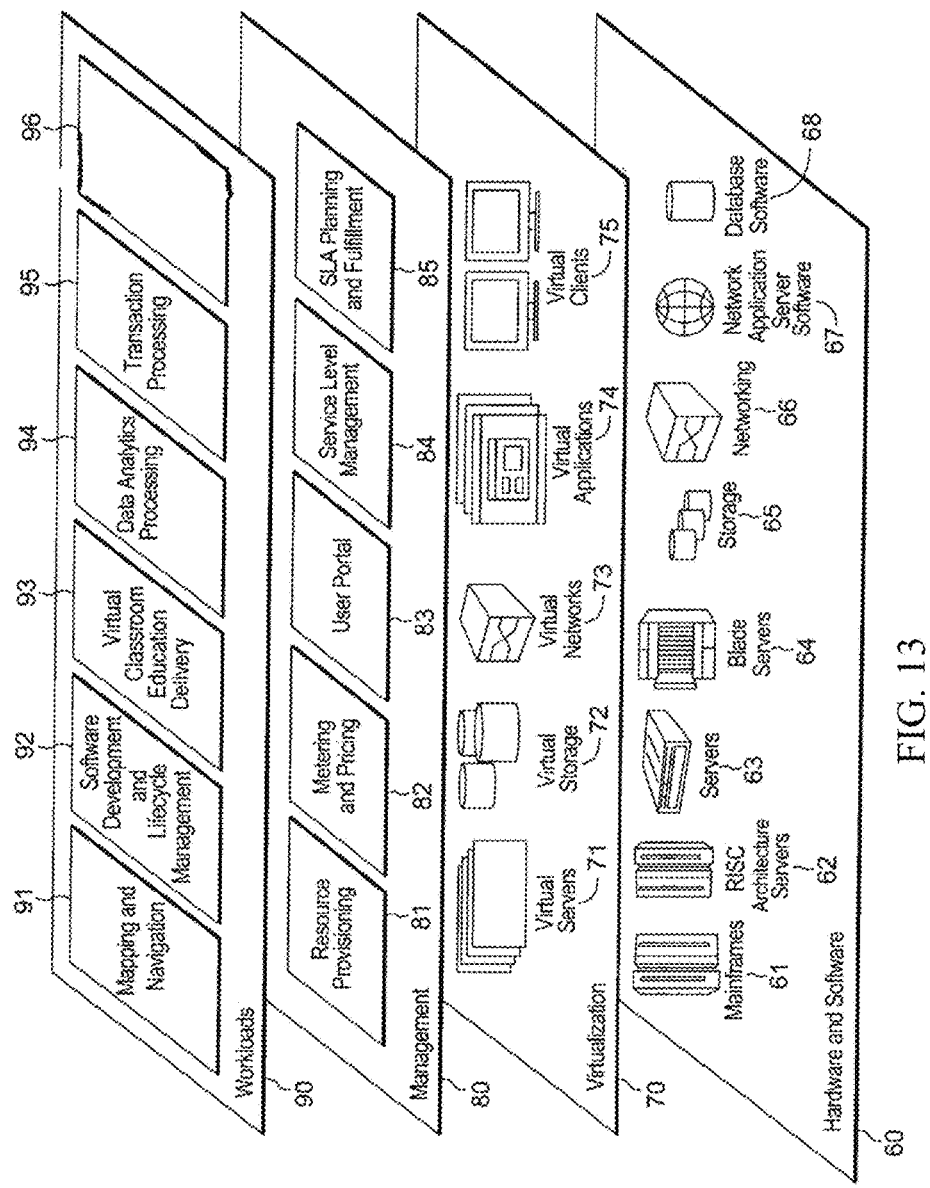
FIG. 13 depicts one example of abstraction model layers.

Referring now to FIG. 13, a set of functional abstraction layers provided by cloud computing environment 50 (FIG. 11) is shown. It should be understood in advance that the components, layers, and functions shown in FIG. 12 are intended to be illustrative only and embodiments of the invention are not limited thereto. As depicted, the following layers and corresponding functions are provided:

Hardware and software layer 60 includes hardware and software components. Examples of hardware components include mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below, which may include maintaining VPD at a VPD location the computer system. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and compressing or decompressing data or reconfiguring data structures utilized for data compression and/or decompression.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In addition to the above, one or more aspects may be provided, offered, deployed, managed, serviced, etc. by a service provider who offers management of customer environments. For instance, the service provider can create, maintain, support, etc. computer code and/or a computer infrastructure that performs one or more aspects for one or more customers. In return, the service provider may receive payment from the customer under a subscription and/or fee agreement, as examples. Additionally or alternatively, the service provider may receive payment from the sale of advertising content to one or more third parties.

In one aspect, an application may be deployed for performing one or more embodiments. As one example, the deploying of an application comprises providing computer infrastructure operable to perform one or more embodiments.

As a further aspect, a computing infrastructure may be deployed comprising integrating computer readable code into a computing system, in which the code in combination with the computing system is capable of performing one or more embodiments.

As yet a further aspect, a process for integrating computing infrastructure comprising integrating computer readable code into a computer system may be provided. The computer system comprises a computer readable medium, in which the computer medium comprises one or more embodiments. The code in combination with the computer system is capable of performing one or more embodiments.

Although various embodiments are described above, these are only examples. For example, computing environments of other architectures can be used to incorporate and use one or more embodiments. Further, different instructions, instruction formats, instruction fields and/or instruction values may be used. Many variations are possible.

Further, other types of computing environments can benefit and be used. As an example, a data processing system suitable for storing and/or executing program code is usable that includes at least two processors coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description, but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. A computer-implemented method, comprising:
    obtaining, by a processor, data comprised of values, wherein the values are of variable size, and generating a value conversion dictionary by applying a parse tree based compression algorithm to the data, wherein the value conversion dictionary is comprised of dictionary entries that represent the values;
    obtaining, by the processor, a distribution of the values and estimating a likelihood for each value based on the distribution;
    generating, by the processor, a code word to represent each value, wherein a size of each code word is inversely proportional to the likelihood of the value represented by the code word;
    assigning, by the processor, a rank to each code word, wherein the rank for each code word represents the likelihood of the value represented by the code word;
    based on the rank associated with each code word, reordering, by the processor, each dictionary entry in the value conversion dictionary to associate each dictionary entry with an equivalent rank, wherein the reordered value conversion dictionary comprises an architected dictionary; and
    storing, by the processor, the architected dictionary as at least one tree structure in a memory, wherein the processor utilizes the architected dictionary to compress data subsequently obtained by the processor, comprising walking from the data, wherein the data comprises dictionary entries, to code words, without the processor performing a memory lookup, and to decompress code words subsequently obtained by the processor, comprising walking from the subsequently obtained code words to the data comprising dictionary entries, without the processor performing a memory lookup, wherein the dictionary entries are of a fixed size, and wherein utilizing the architected dictionary to compress the data subsequently obtained by the processor and to decompress the code words subsequently obtained by the processor comprises locating ranks relevant to the dictionary entries.

2. The computer-implemented method of claim 1, further comprising:
    obtaining, by the processor, the additional data; and
    compressing, by the processor, the additional data utilizing the architected dictionary.

3. The computer-implemented method of claim 1, further comprising:
    obtaining, by the processor, a given code word; and
    decompressing, by the processor, the given code word utilizing the architected dictionary.

4. The computer-implemented method of claim 3, wherein the decompressing comprises walking, by the processor, from the ranks to the architected dictionary.

5. The computer-implemented method of claim 1, wherein the architected dictionary comprises references for each dictionary entry describing parent and child relationships associated with the dictionary entry.

6. The computer-implemented method of claim 5, the reordering comprising:
    associating, by the processor, each dictionary entry with a rank;
    sorting, by the processor, each dictionary entry according to the rank assigned;
    updating, by the processor, the references for each dictionary entry; and
    discarding, by the processor, locations for each dictionary entry in the value conversion dictionary prior to the updating.

7. The computer-implemented method of claim 6, the sorting further comprising, retaining, in a memory, the locations for each dictionary entry in the value conversion dictionary.

8. The computer-implemented method of claim 1, wherein the parse tree based compression algorithm is a Ziv-Lempel compression algorithm.

9. The computer-implemented method of claim 1, wherein the generating and the assigning comprise generating Canonical Huffman Code.

10. The computer-implemented method of claim 1, wherein the values are of variable size.

11. A computer program product comprising:
    a computer readable storage medium readable by one or more processor and storing instructions for execution by the one or more processor for performing a method comprising:
        obtaining, by a processor, data comprised of values, wherein the values are of variable size, and generating a value conversion dictionary by applying a parse tree based compression algorithm to the data, wherein the value conversion dictionary is comprised of dictionary entries that represent the values;

obtaining, by the processor, a distribution of the values and estimating a likelihood for each value based on the distribution;

generating, by the processor, a code word to represent each value, wherein a size of each code word is inversely proportional to the likelihood of the value represented by the code word;

assigning, by the processor, a rank to each code word, wherein the rank for each code word represents the likelihood of the value represented by the code word;

based on the rank associated with each code word, reordering, by the processor, each dictionary entry in the value conversion dictionary to associate each dictionary entry with an equivalent rank, wherein the reordered value conversion dictionary comprises an architected dictionary; and storing, by the processor, the architected dictionary as at least one tree structure in a memory, wherein the processor utilizes the architected dictionary to compress data subsequently obtained by the processor, comprising walking from the data, wherein the data comprises dictionary entries, to code words, without the processor performing a memory lookup, and to decompress code words subsequently obtained by the processor, comprising walking from the subsequently obtained code words to the data comprising dictionary entries, without the processor performing a memory lookup, wherein the dictionary entries are of a fixed size, and wherein utilizing the architected dictionary to compress the data subsequently obtained by the processor and to decompress the code words subsequently obtained by the processor comprises locating ranks relevant to the dictionary entries.

12. The computer program product of claim 11, further comprising:
obtaining, by the processor, the additional data; and
compressing, by the processor, the additional data utilizing the architected dictionary, wherein the compressing comprises walking, by the processor, from dictionary entries to ranks.

13. The computer program product of claim 11, further comprising:
obtaining, by the processor, a given code word; and
decompressing, by the processor, the given code word utilizing the architected dictionary, wherein the decompressing comprises walking, by the processor, from ranks to dictionary entries.

14. The computer program product of claim 11, wherein the value conversion dictionary comprises references for each dictionary entry describing parent and child relationships associated with the dictionary entry.

15. The computer program product of claim 14, the reordering comprising:
associating, by the processor, each dictionary entry with a rank;
sorting, by the processor, each dictionary entry according to the rank assigned;
updating, by the processor, the references for each dictionary entry; and
discarding, by the processor, locations for each dictionary entry in the value conversion dictionary prior to the updating.

16. A system comprising:
a memory;
one or more processor in communication with the memory; and
program instructions executable by the one or more processor via the memory to perform a method, the method comprising:
obtaining, by a processor, data comprised of values, wherein the values are of variable size, and generating a value conversion dictionary by applying a parse tree based compression algorithm to the data, wherein the value conversion dictionary is comprised of dictionary entries that represent the values;
obtaining, by the processor, a distribution of the values and estimating a likelihood for each value based on the distribution;
generating, by the processor, a code word to represent each value, wherein a size of each code word is inversely proportional to the likelihood of the value represented by the code word;
assigning, by the processor, a rank to each code word, wherein the rank for each code word represents the likelihood of the value represented by the code word;
based on the rank associated with each code word, reordering, by the processor, each dictionary entry in the value conversion dictionary to associate each dictionary entry with an equivalent rank, wherein the reordered value conversion dictionary comprises an architected dictionary; and
storing, by the processor, the architected dictionary as at least one tree structure in a memory, wherein the processor utilizes the architected dictionary to compress data subsequently obtained by the processor, comprising walking from the data, wherein the data comprises dictionary entries, to code words, without the processor performing a memory lookup, and to decompress code words subsequently obtained by the processor, comprising walking from the subsequently obtained code words to the data comprising dictionary entries, without the processor performing a memory lookup, wherein the dictionary entries are of a fixed size, and wherein utilizing the architected dictionary to compress the data subsequently obtained by the processor and to decompress the code words subsequently obtained by the processor comprises locating ranks relevant to the dictionary entries.

17. The system of claim 16, wherein the value conversion dictionary comprises references for each dictionary entry describing parent and child relationships associated with the dictionary entry.

18. The system of claim 17, the reordering comprising:
associating, by the processor, each dictionary entry with a rank;
sorting, by the processor, each dictionary entry according to the rank assigned;
updating, by the processor, the references for each dictionary entry; and
discarding, by the processor, locations for each dictionary entry in the value conversion dictionary prior to the updating.

* * * * *